(12) United States Patent
Fujii

(10) Patent No.: US 6,584,599 B2
(45) Date of Patent: Jun. 24, 2003

(54) APPARATUS AND METHOD OF LAYOUT GENERATION, AND PROGRAM THEREOF

(75) Inventor: Takashi Fujii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 68 days.

(21) Appl. No.: 09/984,139

(22) Filed: Oct. 29, 2001

(65) Prior Publication Data

US 2002/0188913 A1 Dec. 12, 2002

(30) Foreign Application Priority Data

Jun. 12, 2001 (JP) ...................................... 2001-176955

(51) Int. Cl.$^7$ .............................................. G06F 17/50
(52) U.S. Cl. ............................... 716/2; 716/13; 716/14; 716/12; 716/8
(58) Field of Search ............................... 716/2, 1, 3–14

(56) References Cited

U.S. PATENT DOCUMENTS

| | | | | |
|---|---|---|---|---|
| 5,745,374 A | * | 4/1998 | Matsumoto ..................... 716/9 |
| 5,995,734 A | | 11/1999 | Saika | |
| 6,253,351 B1 | * | 6/2001 | Fukui et al. .................... 716/2 |
| 6,415,417 B1 | * | 7/2002 | Tanaka et al. .................. 716/2 |
| 6,446,239 B1 | * | 9/2002 | Markosian et al. ............. 716/2 |
| 6,477,695 B1 | * | 11/2002 | Gandhi ........................ 716/17 |
| 2001/0053948 A1 | * | 12/2001 | Kishida et al. ............. 700/121 |
| 2002/0002697 A1 | * | 1/2002 | Kotani et al. .................. 716/2 |
| 2003/0005401 A1 | * | 1/2003 | Wimer ........................ 716/11 |

FOREIGN PATENT DOCUMENTS

| | | |
|---|---|---|
| JP | 9-298243 | 11/1997 |
| JP | 11-003973 | 1/1999 |

* cited by examiner

Primary Examiner—Matthew Smith
Assistant Examiner—Magid Y Dimyan
(74) Attorney, Agent, or Firm—Oblon, Spivak, McClelland, Maier & Neustadt, P.C.

(57) ABSTRACT

A layout generating apparatus and a layout generating method to obtain high-quality optimization results (improvements in operation speed and the degree of integration and a reduction in power consumption). Specifically, there are disposed input data storage part (1), before-compaction layout generating part (2), first compaction processing part (3), second compaction processing part (4), third compaction processing part (5), mid-course-processing data storage part (6), channel-width optimization processing part (7), layout optimization processing part (8), output data storage part (9), and control part (10). The operations of all the mentioned parts are controlled by the control part (10).

11 Claims, 18 Drawing Sheets

F I G. 4
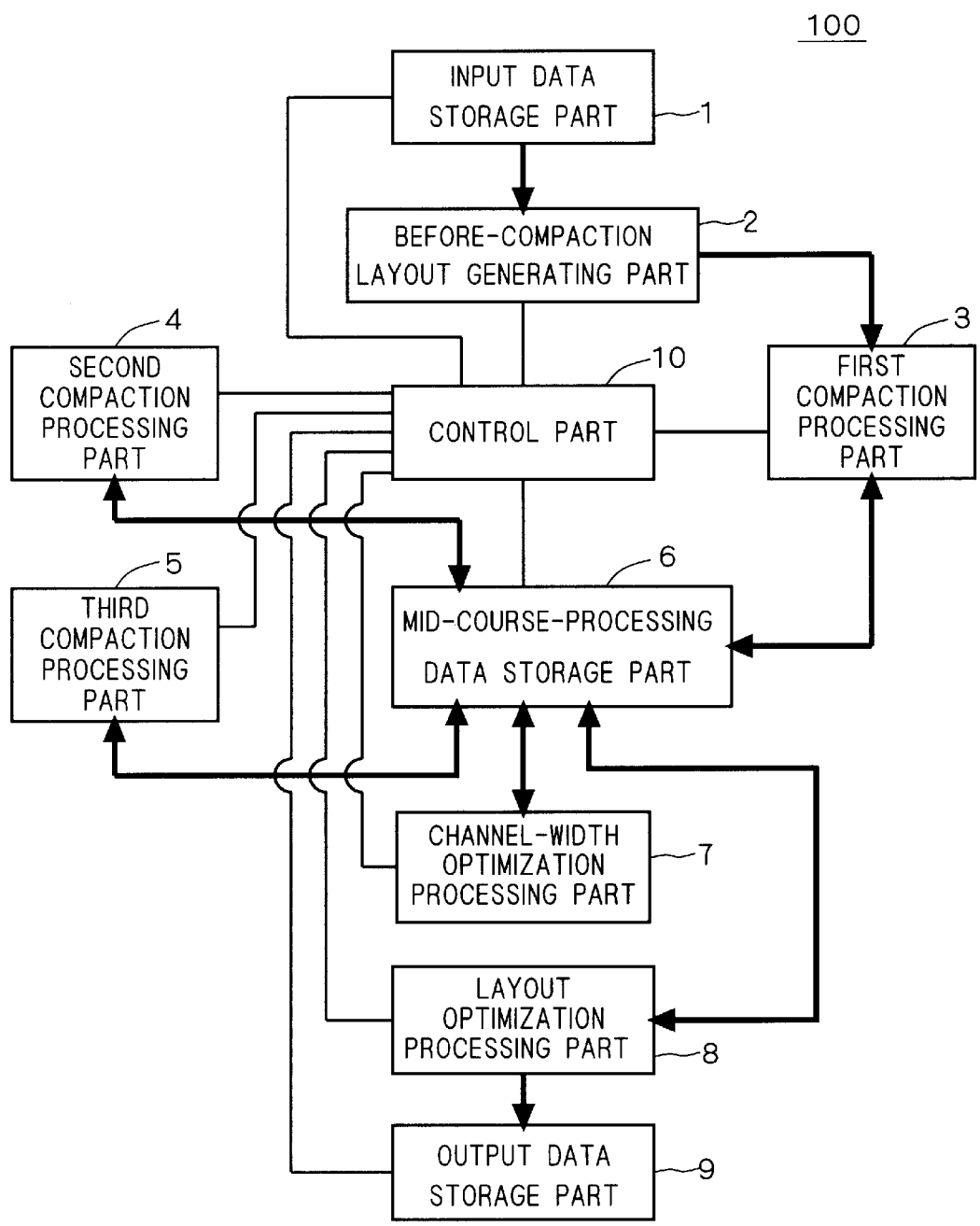

F I G. 13
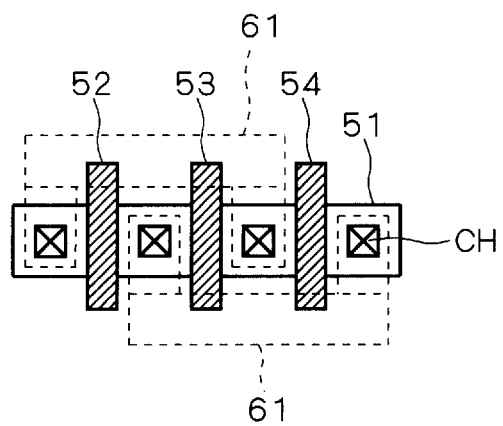
F I G. 14
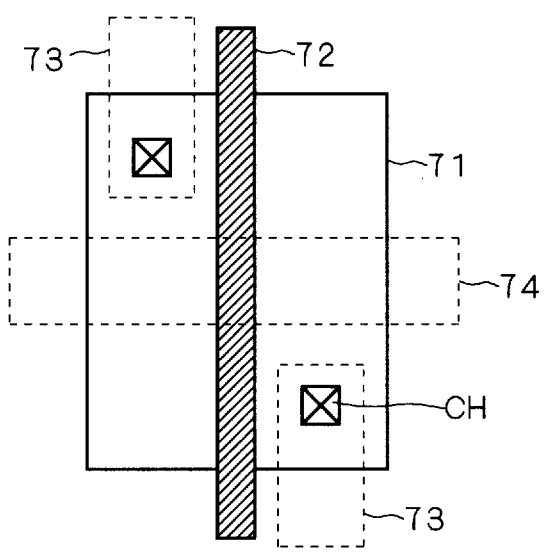

APPARATUS AND METHOD OF LAYOUT GENERATION, AND PROGRAM THEREOF

BACKGROUND OF THE INVENTION

1. Field of the Invention

The present invention relates to a layout generating apparatus and a layout generating method of a semiconductor integrated circuit, as well as a program for directing a computer to execute the method.

2. Description of the Background Art

In designing semiconductor integrated circuits, there is increasing demand for improvements in the degree of integration, operation speed and power consumption of the circuits, whereas there is increasing demand for a reduction in design period. It is therefore required to improve the degree of integration, operation speed and power consumption in a short period of time.

As technique of increasing the efficiency of and automatizing the layout designs of semiconductor integrated circuits, there are, for example, a method called "layout synthesis" to generate a layout based on a net list (i.e., a connected information of transistor level), and a method called "technology migration" to generate a layout of a desired design rule by using a layout drawn under a certain design rule.

When employing these techniques, it is desirable that the channel width of each transistor is optimized in designing a circuit, in order to improve the degree of integration, operation speed and power consumption of the circuit.

Referring now to the flowchart shown in FIG. 22, a procedure of generating a layout according to a conventional layout generating method will be described below.

First, in step S110, the data of a net list stored in memory is inputted, as an input data, to an optimization processing part that optimizes channel widths.

The optimization processing part optimizes a channel width to improve operation speed and reduce power consumption (step S111).

Specifically, the layout area is smaller as the transistor is smaller. In terms of improvements in the degree of integration, a smaller transistor is preferred, however, its operation speed cannot be increased. Also, power consumption might increase by through current due to blunting of waveform. It is therefore necessary to increase the size of a transistor that drives the portions requiring operation speed and the locations subjected to a large blunting of waveform.

Thus, the channel width optimization means to seek a transistor that should have a large channel width, and increase its channel width.

There are a variety of methods for optimizing the channel width of a transistor. One of the methods comprises the steps of: making a net list on which channel widths are minimized; seeking a transistor most contributing to improvements in driving speed and power consumption; and changing the channel width of the transistor. The sequence of these steps is repeated until a desired driving speed is attained.

Other method comprises the steps of allocating a certain value to all of the channel widths of transistors; and performing their respective simulations to obtain a combination of channel widths that produces the best result, as an optimum value.

In any case, when performing optimization, an upper limit value (the maximum value) of the channel width is set to avoid a reduction in the degree of integration of layout. Unless the maximum value is set, by the presence of a transistor occupying a large ratio of the layout area and exerting influence on operation speed and power consumption, the size of this transistor increases infinitely, resulting in a large layout area.

Returning to FIG. 22, in step S112, the net list obtained by optimizing the channel widths is temporarily stored in memory. A layout generation processing part generates a layout based on this net list (step S113).

This layout is then outputted and the sequence of the layout generation processing is completed (step S114).

The problems of the foregoing conventional techniques will be described by referring to FIG. 23 illustrating a buffer layout.

FIG. 23 illustrates the layout of a buffer formed by two CMOS inverters. In FIG. 23, an active area 21 where a P channel MOS transistor (PMOS transistor) is to be formed is disposed on the upper side, and an active area 31 where an N channel MOS transistor AMOS transistor) is to be formed is disposed on the lower side.

Gate electrodes 22 and 23 are placed in parallel on the active area 21. The portions of the active area 21, which locate at the side exterior in the longitudinal direction of the gate electrodes 22 and 23, become source/drain regions. Each of the source/drain regions is connected via a plurality of contact portions to an overlying first layer metal wiring 41. The portions of the active area 21, which underlie the gate electrodes 22 and 23, become channel regions.

Likewise, gate electrodes 32 and 33 are placed in parallel on the active area 31. The portions of the active area 31, which locate at the side exterior in the longitudinal direction of the gate electrodes 32 and 33, become source/drain regions. Each of the sour/drain region is connected via a plurality of contact portions to the overlying first layer metal wiring 41. The portions of the active area 31, which underlie the gate electrodes 32 and 33, become channel regions.

Referring to FIG. 23, when considering the two PMOS transistors on the active area 21, it is found that the gate electrode 22 is shorter than the gate electrode 23, and these electrodes have different channel widths. This is due to the connection constraint with the first layer metal wiring 41 and other wiring (not shown), by which the upper limit value of the channel widths on this circuit is determined. In general, the upper limit value of a channel width is more lowered at more complicated wiring location.

With the conventional layout generating method, the upper limit value of a channel width is set in the channel width optimization, however, this value is given as a whole. For example, an upper limit is set circuit by circuit. Actually, depending on the layout shape, the upper limit of a channel width is different transistor by transistor, as previously described. Therefore, the conventional techniques cannot accurately provide the upper limit value of a channel width at the time of optimization.

For instance, in FIG. 23, of the two PMOS transistors in the active area 21, the right transistor, as viewed in the figure, has room for increasing its channel width. Of the two NMOS transistors in the active area 31, the right transistor, as viewed in the figure, has room for increasing its channel width.

When a layout is generated setting an upper limit to a large value, the layout area is increased. On the contrary, setting the upper limit to a small value decreases the degree of freedom of optimization, which causes the degradation of optimization (i.e., a drop in operation speed and an increase in power consumption on circuit).

SUMMARY OF THE INVENTION

According to a first aspect of the invention, a layout generating apparatus to generate a layout of a semiconductor integrated circuit comprises: a compaction processing part to perform a compaction processing for converting an inputted input layout into a layout satisfying a predetermined design rule; and a channel-width optimization processing part to optimize a channel width of a transistor forming the semiconductor integrated circuit, the compaction processing part having a channel-width maximization processing part that maximizes the channel width of the transistor without changing a layout area to generate a layout after channel-width maximization and obtain a maximum channel-width value, the channel-width optimization processing part optimizing the channel width of the transistor by using the maximum channel-width value as an upper limit value.

According to a second aspect of the invention, the layout generating apparatus of the first aspect is characterized in that the compaction processing part further has a channel-width minimization processing part that minimizes the channel width of the transistor without changing a layout area to generate a layout after channel-width minimization and obtain a minimum channel-width value, the channel-width optimization processing part optimizing the channel width of the transistor by using the maximum channel-width value as an upper limit value and the minimum channel-width value as a lower limit value.

According to a third aspect of the invention, the layout generating apparatus of the first aspect further comprises a parasitic capacity/resistance sampling processing part to obtain a parasitic capacity and a resistance value of wiring of the transistor based on the layout after channel-width maximization, wherein the channel-width optimization processing part optimizes the channel width of the transistor on receipt of data of the parasitic capacity and the resistance value.

According to a fourth aspect of the invention, the layout generating apparatus of the first aspect is characterized in that the input layout is a temporal layout generated based on a net list data.

According to a fifth aspect of the invention, the layout generating apparatus of the first aspect is characterized in that the input layout is obtained by subjecting a layout generated under a design rule different from the predetermined design rule, to a preprocessing in a technology migration processing.

According to a sixth aspect of the invention, a layout generating method of generating a layout of a semiconductor integrated circuit comprises the steps of: (a) performing a compaction processing for converting an inputted input layout into a layout satisfying a predetermined design rule; and (b) optimizing the channel width of a transistor forming the semiconductor integrated circuit, the step (a) including: (a-1) maximizing the channel width of the transistor without changing a layout area to obtain a layout after channel-width maximization; and (a-2) obtaining a maximum channel-width value from the layout after channel-width maximization, the step (b) including the step of optimizing the channel width of the transistor by using the maximum channel-width value as an upper limit value.

According to a seventh aspect of the invention, the layout generating method of the sixth aspect is characterized in that the step (a) further includes: (a-3) minimizing the channel width of the transistor without changing a layout area to obtain a layout after channel-width minimization; and (a-4) obtaining a minimum channel-width value from the layout after channel-width minimization, the step (b) including the step of optimizing the channel width of the transistor by using the maximum channel-width value as an upper limit value and the minimum channel-width value as a lower limit value.

According to an eighth aspect of the invention, the layout generating method of the sixth aspect further comprises the step (c), prior to the step (b), of obtaining a parasitic capacity and a resistance value of wiring of the transistor based on the layout after channel-width maximization, the step (b) including the step of optimizing the channel width of the transistor on receipt of data of the parasitic capacity and the resistance value.

According to a ninth aspect of the invention, the layout generating method of the sixth aspect is characterized in that the input layout is generated as a temporal layout, prior to the step (a) and based on a net list data.

According to a tenth aspect of the invention, the layout generating method of the sixth aspect is characterized in that the input layout is obtained, prior to the step (a), by subjecting a layout generated under a design rule different from the predetermined design rule, to a preprocessing in a technology migration processing.

According to an eleventh aspect of the invention, a program for directing a computer to execute the layout generating method of the sixth aspect.

In the layout generating apparatus of the first aspect, the compaction processing part has the channel-width maximization processing part that maximizes the channel width of a transistor without changing the layout area to generate a layout after channel-width maximization, and obtains a maximum channel-width value. The channel-width optimization processing part optimizes the channel width of the transistor by using the maximum channel-width value as an upper limit value. Therefore, a layout having a channel width optimized based on the layout constraint can be obtained per transistor. Since an optimum channel width is obtained based on the result of such an optimization processing that a channel width is maximized without changing the layout area, a larger channel width can be obtained, thereby increasing the operation speed of the semiconductor integrated circuit. In addition, setting the condition so as to satisfy the operation speed constraint does not unnecessarily increase the channel width of a transistor involving an increase in layout area but increases the channel width of a transistor causing no increase in layout area, thus permitting an increase in operation speed. As a result, the layout area can be reduced to increase the degree of freedom of channel width selection, which increases the degree of freedom of optimization and allows for a reduction in power consumption.

In the layout generating apparatus of the second aspect, the compaction processing part further has the channel-width minimization processing part that minimizes the channel width of a transistor without changing the layout area, to generate a layout after channel-width minimization and obtains a minimum channel-width value. The channel-width optimization processing part optimizes the channel width of the transistor by using the maximum channel-width value as an upper limit value and the minimum channel-width value as a lower limit value. Therefore, a layout having a channel width optimized more accurately based on the layout constraint can be obtained per transistor. As a result, there is no possibility that an excessive reduction of channel width causes a decrease or an increase in layout area, thus failing to achieve the target layout area. This avoids elongating of the design period necessary for correction.

The layout generating apparatus of the third aspect further comprises the parasitic capacity/resistance sampling processing part to obtain the parasitic capacity and resistance value of the wiring of the transistor based on a layout after channel-width maximization. Therefore, the channel width is optimized not only based on the layout constraint but also in consideration of the resistance value and parasitic capacity of the wiring, thereby obtaining the channel-width optimization result of high reliability. As a result, there is no possibility of failing to obtain a desired characteristic due to a channel-width optimization processing of low reliability. This avoids elongating of the design period necessary for correction.

In the layout generating apparatus of the fourth aspect, an input layout is a temporal layout generated based on a net list data, and the so-called layout synthesis processing generates the input layout. Therefore, a variety of design rules can be used and there can be provided a flexible operation, for example, the layout shape to be outputted can be controlled to a certain degree.

In the layout generating apparatus of the fifth aspect, an input layout is obtained by subjecting a layout generated under a design rule different from a predetermined design rule to a preprocessing in the technology migration. Therefore, the design period can be made shorter than the layout synthesis processing of generating a layout from a net list.

With the layout generating method of the sixth aspect, in the step (a-1), a layout after channel-width maximization is generated by maximizing the channel width of a transistor without changing the layout area; in the step (a-2), a maximum channel-width value is obtained from the layer after channel-width maximization; and in the step (b), the channel width of the transistor is optimized by using the maximum channel-width value as an upper limit value. Therefore, a layout having a channel width optimized based on the layout constraint can be obtained per transistor. Since an optimum channel width is obtained based on the result of such an optimization processing that a channel width is maximized without changing the layout area, a larger channel width can be obtained, thereby increasing the operation speed of the semiconductor integrated circuit. In addition, setting the condition so as to satisfy the operation speed constraint does not unnecessarily increase the channel width of a transistor involving an increase in layout area but increases the channel width of a transistor causing no increase in layout area, thus permitting an increase in operation speed. As a result, the layout area can be reduced to increase the degree of freedom of channel width selection, which increases the degree of freedom of optimization and allows for a reduction in power consumption.

With the layout generating method of the seventh aspect, in the step (a-3), a layout after channel-width minimization is generated by minimizing the channel width of a transistor without changing the layout area; in the step (a-4), a minimum channel-width value is obtained from the layout after channel-width minimization; and in the step (b), the channel width of the transistor is optimized by using the maximum channel-width value as an upper limit value and the minimum channel-width value as a lower limit value. Therefore, a layout having a channel width optimized more accurately based on the layout constraint can be obtained per transistor. As a result, there is no possibility that an excessive reduction of channel width causes a decrease or an increase in layout area, thus failing to achieve the target layout area. This avoids elongating of the design period necessary for correction.

With the layout generating method of the eighth aspect, in the step (c), the parasitic capacity and resistance value of wiring of the transistor are obtained based on the layout after channel-width maximization; in step (b), the channel width of the transistor is optimized on receipt of the data of the parasitic capacity and resistance value. Therefore, the channel width is optimized not only based on the layout constraint but also in consideration of the resistance value and parasitic capacity of the wiring, thereby obtaining the channel-width optimization result of high reliability. As a result, there is no possibility of failing to obtain a desired characteristic due to a channel-width optimization processing of low reliability. This avoids elongating of the design period necessary for correction.

With the layout generating method of the ninth aspect, the so-called layout synthesis processing generates an input layout. Therefore, a variety of design rules can be used, and there can be provided a flexible operation, for example, the layout shape to be outputted can be controlled to a certain degree.

With the layout generating method of the tenth aspect, the design period can be made shorter than the layout synthesis processing of generating a layout from a net list.

With the eleventh aspect, a layout having a channel width optimized based on the layout constraint can be obtained by executing the program.

It is an object of the present invention to overcome the foregoing problems by providing a layout generating apparatus and a layout generating method to obtain high-quality optimization results (improvements in operation speed and in the degree of integration and a reduction in power consumption).

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a block diagram illustrating the configuration of a layout generating apparatus according to a first preferred embodiment of the invention;

FIGS. 12 to 14 are layout diagrams illustrating the problem arises when setting no lower limit value of layout optimization;

DESCRIPTION OF THE PREFERRED EMBODIMENTS

Concept of the Invention

The concept of the invention is to obtain, prior to an optimization processing of a channel width, the maximum and minimum values of the channel width in a compaction processing, and then perform the optimization processing based on the obtained maximum and minimum values of the channel width.

Compaction Processing

Figure 1:
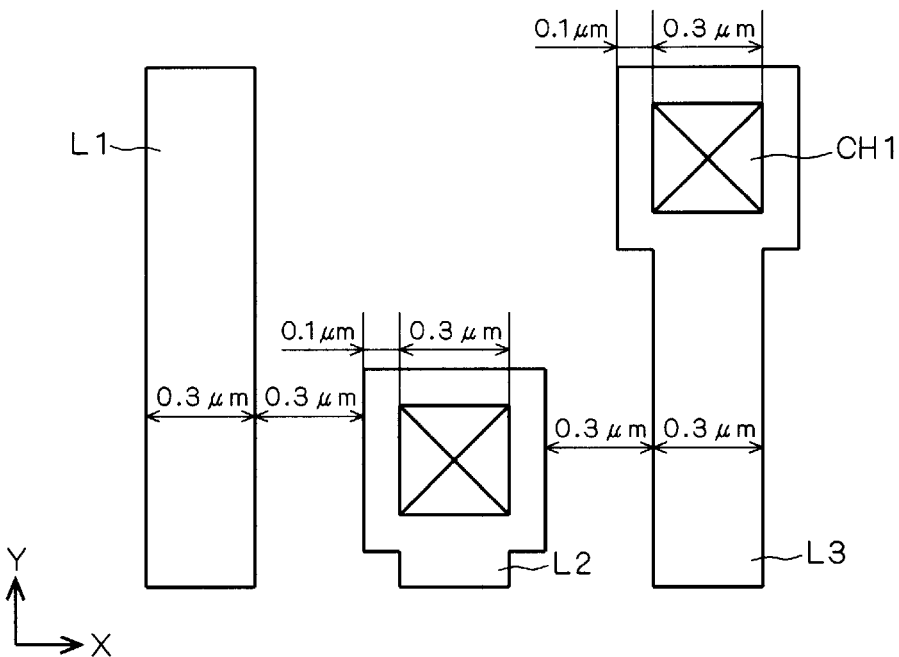
FIGS. 1 to 3 are layout diagrams illustrating an exemplary compaction processing.
Figure 2:
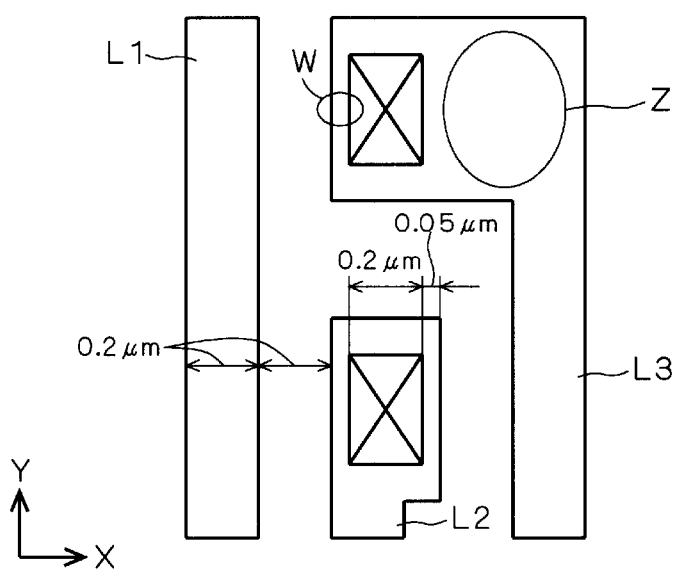
Figure 3:
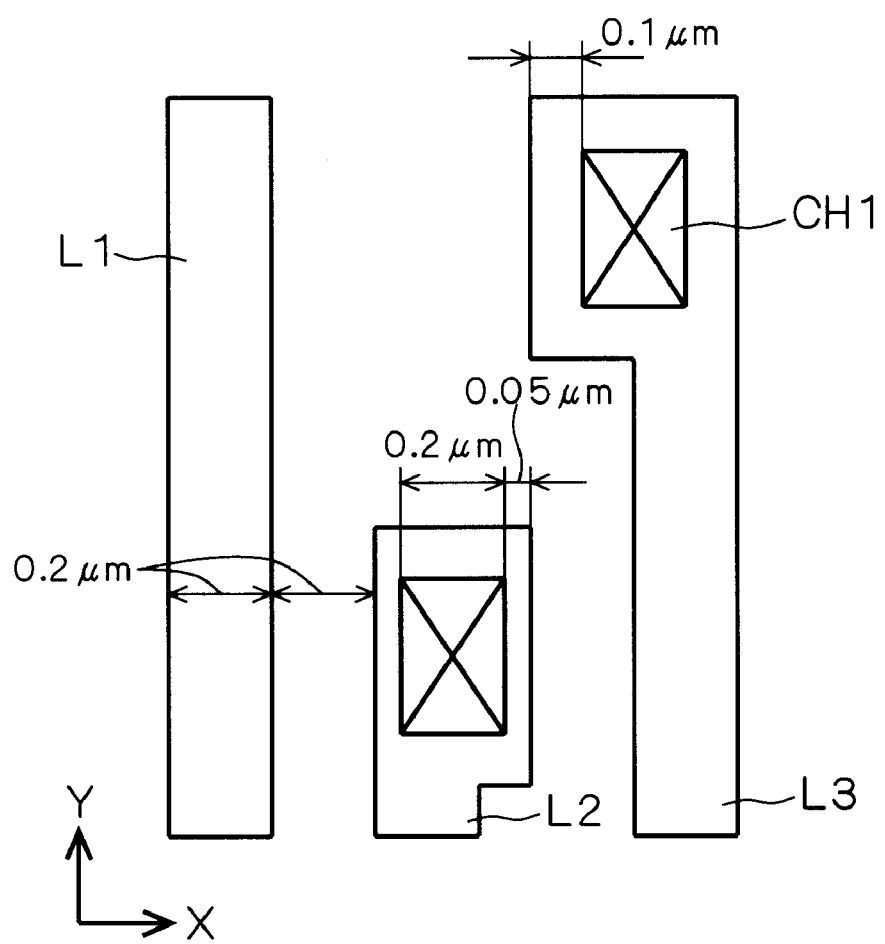

Prior to the description of preferred embodiments of the invention, an exemplary compaction processing will be presented by referring to FIGS. 1 to 3.

"Compaction processing" is one which converts a certain layout into a layout satisfying a desired design rule, and which processes the layout on a two-dimensional plane (X and Y directions). In the following, for convenience, the compaction processing in the X direction is described.

FIG. 1 shows an initial layout, on which three wirings L1, L2 and L3 are placed in parallel.

The wiring L1 has no contact portion and extends in the Y direction with a wiring width of 0.3 μm, and the wiring L2 has a contact portion CH1 having a width of 0.3 μm. The cover margin between the contact portion CH1 and the wiring L2 is 0.1 μm. The wiring L3 has a contact portion CH1, and the cover margin between the contact portion CH1 and the wiring L3 is 0.1 μm. The distance between wirings is 0.3 μm, and each wiring width is 0.3 μm.

FIG. 2 shows the result of an area reduction processing that is the first stage of the compaction processing. That is, there is illustrated a layout in accordance with the design rule that the wiring width of each wiring is 0.2 μm, distance between wirings is 0.2 μm, the width of the contact portion CH1 is 0.2 μm, and the cover margin between the contact portion CH1 and the wiring L2 or L3 is 0.05 μm.

In the compaction processing, firstly, the edges of all patterns are generally moved downward toward the left, as viewed in the figure. Since this exemplary compaction processing is limited to the X direction, FIG. 2 shows the result that the edges of all patterns are moved to the left as much as possible.

Problems in the layout of FIG. 2 are regions W and Z. That is, in the region W, the cover margin between the contact portion CH1 and the wiring L3 is the minimum value (0.05 μm). In general, however, the cover margins of slightly larger than the minimum value can reduce contact resistance and improve yield.

Whereas in the Z region, the cover margin is unnecessarily widened and the wiring width is therefore widened. This might increase wiring capacity and wiring resistance.

To solve these problems is the optimization processing that is the second stage of the compaction processing.

Optimization processing is to make correction of a layout without increasing the layout area. FIG. 3 shows the result obtained by performing the optimization processing.

In FIG. 3, the right and left cover margins between a contact portion CH1 and wiring L3 are both 0.1 μm, which is larger than 0.05 μm that is the minimum value of the design rule. Thereby, the problems in the layout of FIG. 2 can be solved.

The foregoing is the outline of the compaction processing. In practice, the processing in the Y direction is also performed. Examples of the compaction processing are a one-dimensional method of alternately performing the compaction processing in the X and Y directions, and a two-dimensional method of performing the compaction processing in the X and Y directions at the same time.

A. FIRST PREFERRED EMBODIMENT

A-1. Configuration of Apparatus

FIG. 4 shows the configuration of a layout generating apparatus 100, as a first preferred embodiment of the invention.

Referring to FIG. 4, the layout generating apparatus 100 comprises an input data storage part 1, before-compaction layout generating part 2, first compaction processing part 3, second compaction processing part 4, third compaction processing part 5, mid-course processing data storage part 6, channel-width optimization processing part 7, layout optimization processing part 8, output data storage part 9, and control part 10. The operations of these parts are controlled by the control part 10. In FIG. 4, bold arrows indicate the data flow among respective parts.

A-2. Operation of Apparatus

Figure 5:
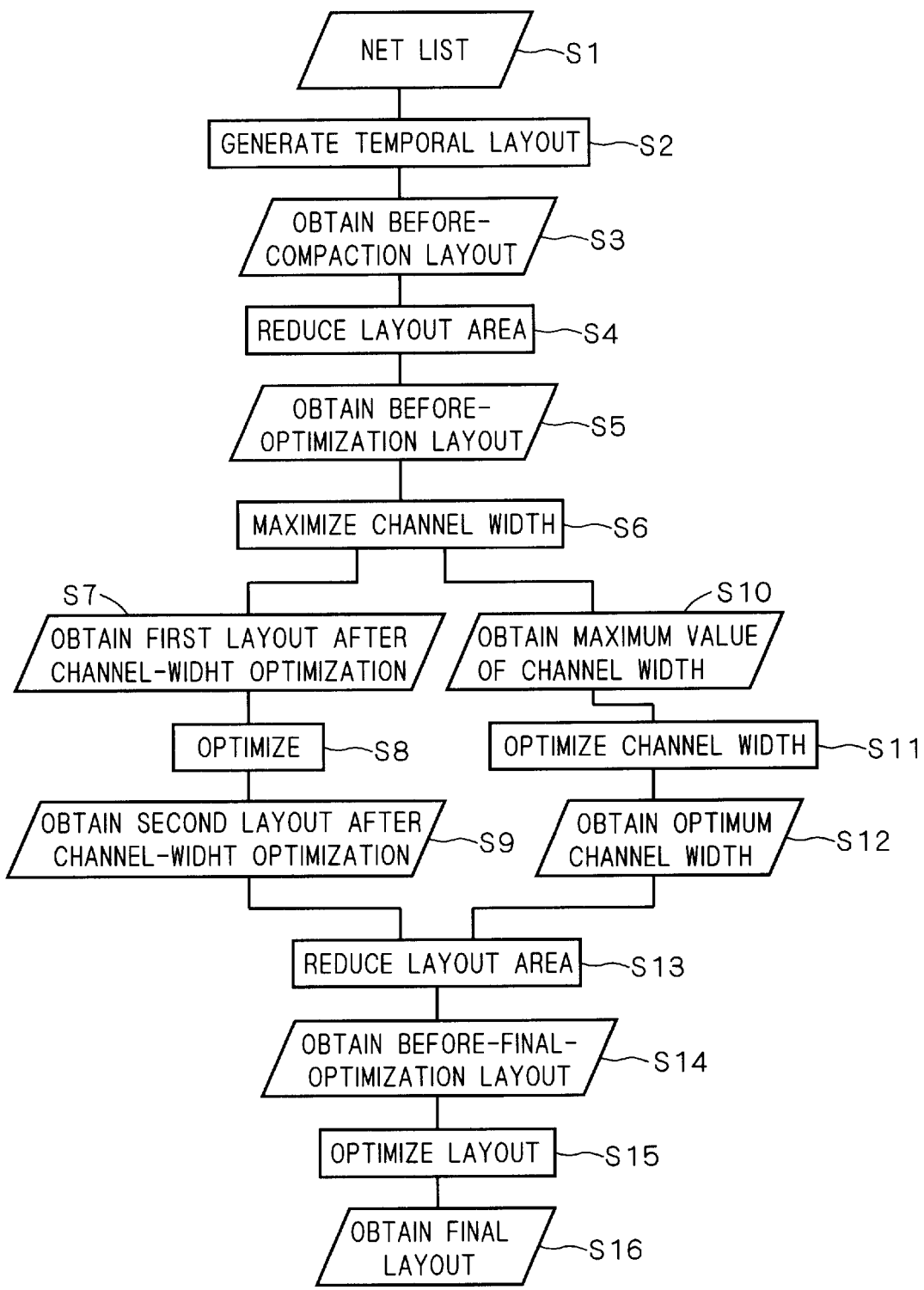
FIG. 5 is a flowchart illustrating the operation of the layout generating apparatus of the first preferred embodiment.

The procedure of layout generation is described with respect to FIG. 5 that is a flowchart of the operation of the layout generating apparatus 100, and the functions and operations of the respective parts are described by referring to FIG. 4.

In step S1 in FIG. 5, a net list data (a connected information of transistor level) is inputted to the before-compaction layout generating part 2 in FIG. 4.

In the before-compaction layout generating part 2, a temporal layout is generated based on the net list (step S2). At this stage, the layout is made without restrictedly according with a design rule. Thereafter, connection of contacts having the same potential, insertion of jogs (the folding portions used for conducting compaction processing while avoiding adjacent patterns), and correction of transistor sizes, are performed to obtain a layout before compaction processing (step S3).

As shown in steps S1 and S2, the processing of generating, based on the net list, the temporal layout and using it as an input data of the compaction processing, is referred to as "layout synthesis."

In step S4, the data of the layout before compaction processing is inputted to the first compaction processing part 3 in FIG. 4, to perform a layout area reduction. This is the first stage of the compaction processing. Its detailed description is omitted here because its outline is previously described with respect to FIG. 2, however, one exemplary layout to be obtained by the foregoing processing is illustrated in FIG. 6.

Figure 6:
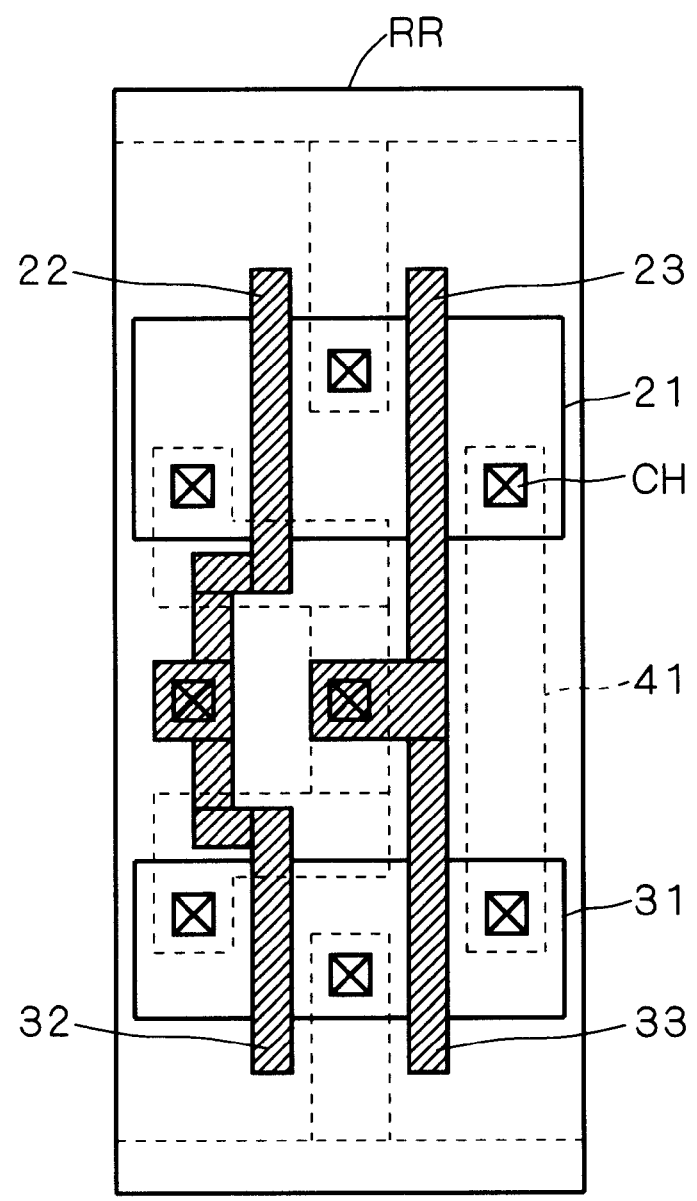
FIGS. 6 to 8 are layout diagrams illustrating the layout generation steps in the layout generating apparatus of the first preferred embodiment.

FIG. 6 illustrates the layout of a buffer formed by two CMOS inverters, which is the result obtained by reducing the area of the before-compaction-processing layout so as to satisfy the target layout size.

In FIG. 6, an active area 21 where a P channel MOS transistor (PMOS transistor) is to be formed is disposed on the upper side, and an active area 31 where an N channel MOS transistor (NMOS transistor) is to be formed is disposed on the lower side.

Gate electrodes 22 and 23 are placed in parallel on the active area 21. The portions of the active area 21, which locate at the side exterior in the longitudinal direction of the gate electrodes 22 and 23, become source/drain regions. Each of the source/drain regions is connected via a plurality of contact portions to an overlying first layer metal wiring 41. The portions of the active area 21, which underlie the gate electrodes 22 and 23, become channel regions.

Likewise, gate electrodes 32 and 33 are placed in parallel on the active area 31. The portions of the active area 31, which locate at the side exterior in the longitudinal direction of the gate electrodes 32 and 33, become source/drain regions. Each of the source/drain regions is connected via a plurality of contact portions to the overlying first layer metal wiring 41. The portions of the active area 31, which underlie the gate electrodes 32 and 33, become channel regions.

Referring to FIG. 6, no optimization is performed, and a rectangular region RR indicated by solid line shows the target layout size. From this, it is found that there is room for further enlarging the active areas 21 and 31.

Such a before-optimization layout is obtained by the layout-area reduction processing (step S5). Data of the before-optimization layout may be temporarily stored in the mid-course-processing data storage part 6 in FIG. 4, and it may be read out on demand in the processing of the next step S6.

In step S6, the before-optimization layout data is inputted to the second compaction processing part 4 (channel width maximization processing part) in FIG. 4, to perform a channel-width maximization. By this processing, a first layout after channel-width maximization is obtained (step S7).

This processing corresponds to the optimization processing that is the second stage of the compaction processing described with respect to FIG. 3. At this stage, there is performed such an optimization processing that the channel width of each transistor is optimized without increasing the layout area. Its detailed description is omitted here because its outline is previously described with respect to FIG. 3, however, one exemplary layout to be obtained by this processing is illustrated in FIG. 7.

Figure 7:
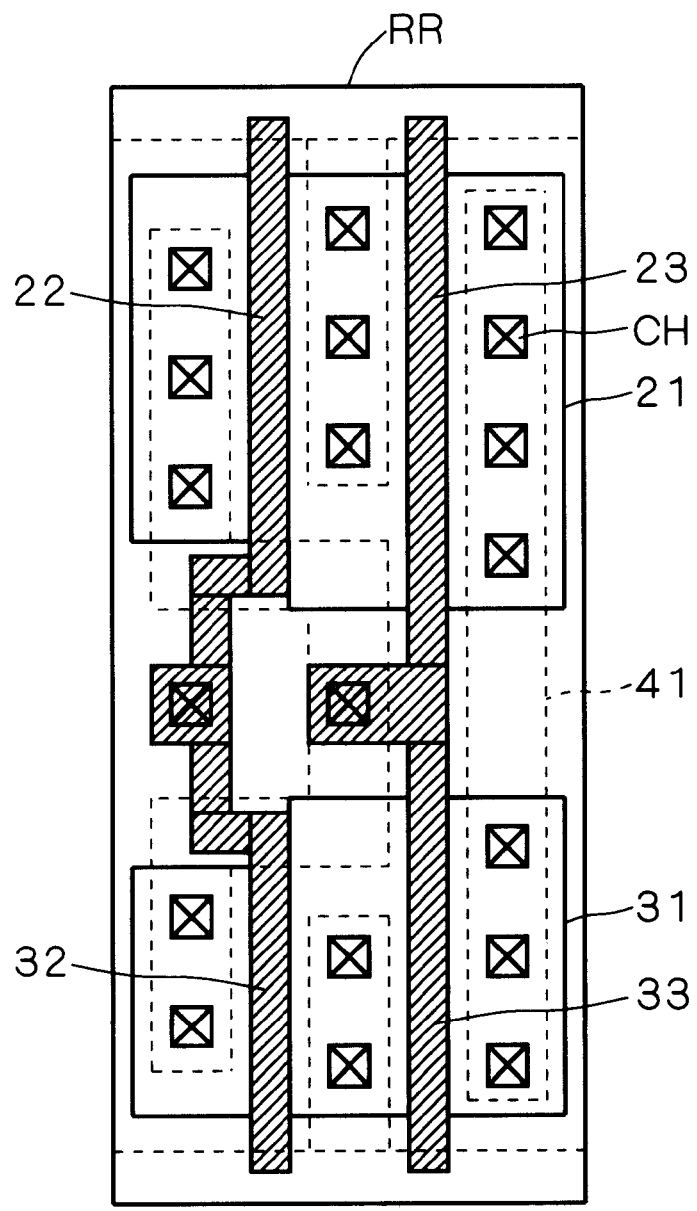

FIG. 7 illustrates one exemplary layout to be obtained based on the before-optimization layout shown in FIG. 6. In FIG. 7, the same references have been used as in FIG. 6 for similar components. The description of the same components is omitted herein.

Referring to FIG. 7, as compared to the state of FIG. 6, the active areas 21 and 31 are enlarged such that the channel width of each transistor is maximized, and the gate electrodes 22, 23 and the gate electrodes 32, 33 are therefore elongated, resulting in the maximum transistor size. The number of contact portions CH is also increased in accordance with the enlarged transistor size.

A first layout data after channel-width maximization may be temporarily stored in the mid-course-processing data storage part 6 in FIG. 4, and it may be read out on demand in the processing of step S8.

The data of the channel width of each transistor that is obtained in step S6 may be taken as the maximum value of the channel width (step S10), and stored in the mid-course-processing data storage part 6, and then read out on demand in the processing of step S11.

The processing of step S6 is an optimization processing of maximizing channel width. In the compaction processing, not only channel width but wiring interval, wiring width, the contact portion width, and the cover margin between the contact portion and wiring, are also optimized as previously described with respect to FIG. 3. The optimization of elements other than channel width is also performed, which is the optimization processing in step S8.

In step S8, the first layout data after channel-width maximization is inputted to the third compaction processing part 5 in FIG. 4, to perform optimization of elements other than channel width.

This processing also corresponds to the optimization processing that is the second stage of the compaction processing described with respect to FIG. 3. Its detailed description is omitted herein because its outline is previously described with respect to FIG. 3. By this processing, a second layout after channel-width maximization is obtained (step S9).

On the other hand, in step S11, the data of the maximized channel width, which is separated from the first layout data after channel-width maximization, is inputted to the channel-width optimization processing part 7 in FIG. 4, to perform a channel-width optimization. By this processing, data of the channel width thus optimized is obtained (step S12).

The channel-width optimization processing in step S11 is to determine the channel width by using the maximized channel width as an upper limit value. Specifically, the channel width is optimized transistor by transistor, to realize improvements in operation speed and a reduction in power consumption on circuit, which could be disposed in trade-off relationship in some cases.

Assuming the case that the maximized channel widths of two transistors A and B, which were obtained in step S10, are 0.5 $\mu$m and 2.0 $\mu$m, respectively. In step S11, optimization is performed using these values as an upper limit value of the channel width.

Under the condition that a desired circuit characteristic (i.e., operation speed and power consumption) is satisfied when the sum of the channel widths of the two transistors is 2.0 $\mu$m, there is obtained a solution of not increasing the layout area from the mentioned upper limits. That is, the channel width of the transistor A is 0.5 $\mu$m; and the channel width of the transistor B is 1.5 $\mu$m.

On the other hand, the conventional method not having step S6 and step S10 cannot obtain an appropriate upper limit value of a channel width. Therefore, it can be considered to select, as a solution satisfying the above condition, such a setting that the channel width of the transistor A is 1.0 μm and the channel width of the transistor B is 1.0 μm. As a result, the layout area is increased.

Thus, when performing the channel-width optimization, the quality of the channel width optimization can be increased with the appropriate upper limit value of the channel width determined in consideration of the layout constraint.

Data of the optimized channel width may be temporarily stored in the mid-course-processing data storage part 6 in FIG. 4, and it may be read out on demand in the processing of step S13.

Data of the second layout after channel-width maximization obtained in step S9, and data of the optimized channel width obtained in step S12, are inputted to the first compaction processing part 3 in FIG. 4, to perform a layout-area reduction (step S13).

The reason why the layout-area reduction is conducted here again is that the layout-area reduction processing in step S4 cannot be executed to the very limit, in order to effectively perform the following processing, and there might be room for reduction. In step S13, the data of the optimized channel width is combined with the second layout after channel-width maximization and, if there is the mentioned room for reduction, a further reduction is executed.

By this processing, a before-final-optimization layout is obtained (step S14). Data of the before-final-optimization layout may be temporarily stored in the mid-course-processing data storage part 6 in FIG. 4, and it may be read out on demand in the processing of the next step S15.

The before-final-optimization layout data obtained in step S14 is then inputted to the layout optimization processing part 8 in FIG. 4, to perform the final optimization processing of the layout. This results in the layout having an appropriate channel width.

Figure 8:
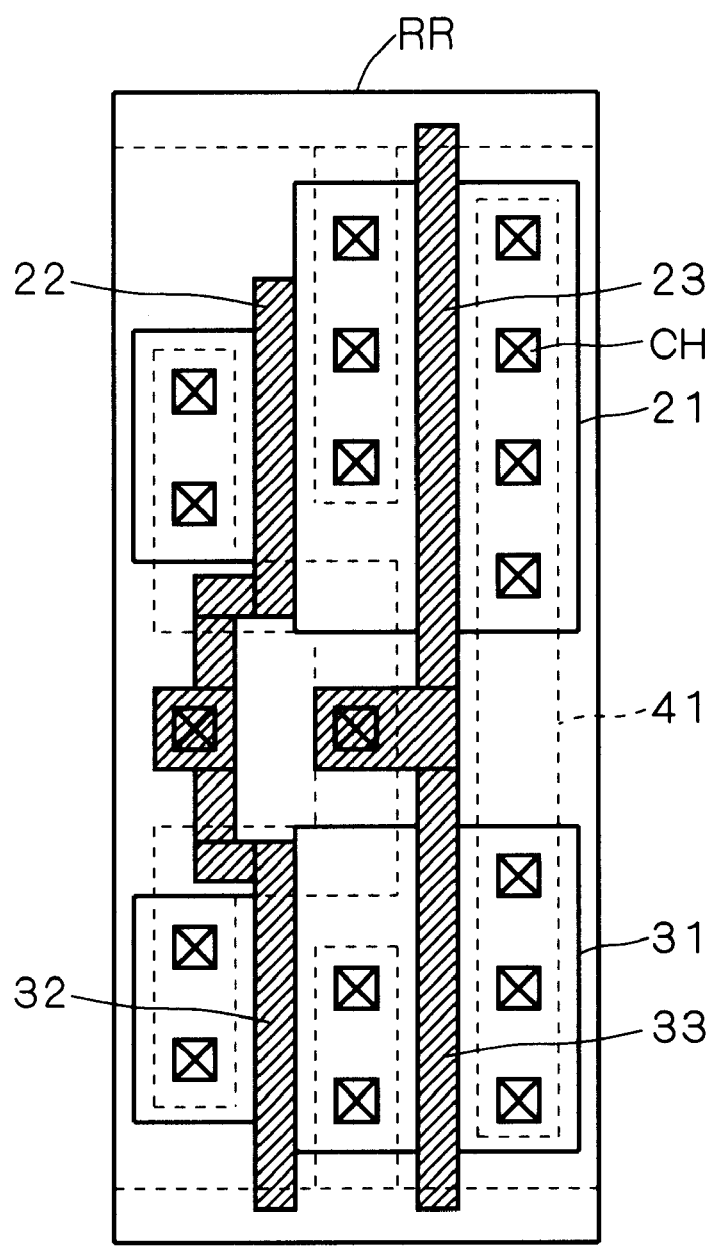

An exemplary final layout thus obtained is illustrated in FIG. 8. In FIG. 8, the same references have been used as in FIG. 7 for similar components. The description of the same components is omitted herein.

Referring to FIG. 8, the lengths of gate electrodes 23 and 33 are the same as in the first layout after channel-width maximization shown in FIG. 7, whereas the lengths of gate electrodes 22 and 32 are shorter than in the layout of FIG. 7. This is because the channel width is optimized accurately based on the layout constraint.

The final layout data obtained by this processing may be temporarily stored in the output data storage part 9 in FIG. 4, so that the user of the layout generating apparatus 100 can read it out on demand.

A-3. Resulting Effects

As set forth, the layout generating apparatus 100 according to the invention can provide the layout in which the channel width is optimized based on the layout constraint.

The optimum channel width is obtained based on the result of such an optimization processing that the channel width is maximized without increasing the layout area. Therefore, a larger channel width can be obtained to increase the operation speed on circuit.

Also, the optimum channel width is obtained based on the result of such an optimization processing that the channel width is maximized without increasing the layout area. Therefore, setting the condition so as to satisfy the operation speed constraint, for example, does not unnecessarily increase the channel width of a transistor involving an increase in layout area, but does increase the channel width of a transistor causing no increase in layout area. This allows for an increase in operation speed and a reduction in layout area, thereby increasing the degree of freedom of channel width selection. As a result, the degree of freedom of optimization is increased to permit a reduction in power consumption.

B. SECOND PREFERRED EMBODIMENT

B-1. Configuration of Apparatus

Figure 9:
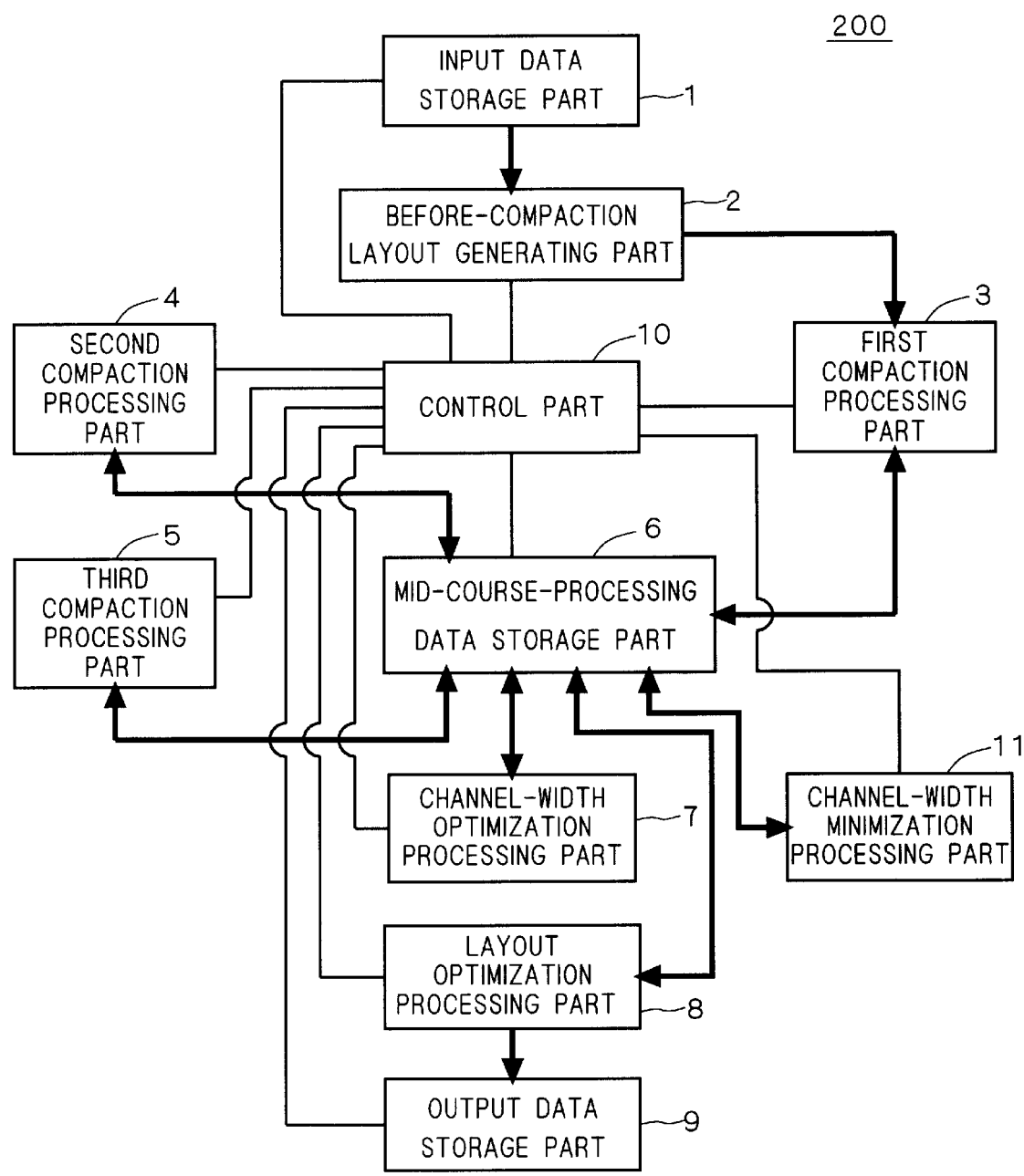
FIG. 9 is a block diagram illustrating the configuration of a layout generating apparatus according to a second preferred embodiment of the invention.

As a second preferred embodiment, the configuration of a layout generating apparatus 200 is illustrated in FIG. 9.

The layout generating apparatus 200 of FIG. 9 further comprises a channel-width minimization processing part 11, in addition to the components of the layout generating apparatus 100 described with respect to FIG. 4. The operation of the channel-width minimizing part 11 is also controlled by the control part 10.

B-2. Operation of Apparatus

Figure 10:
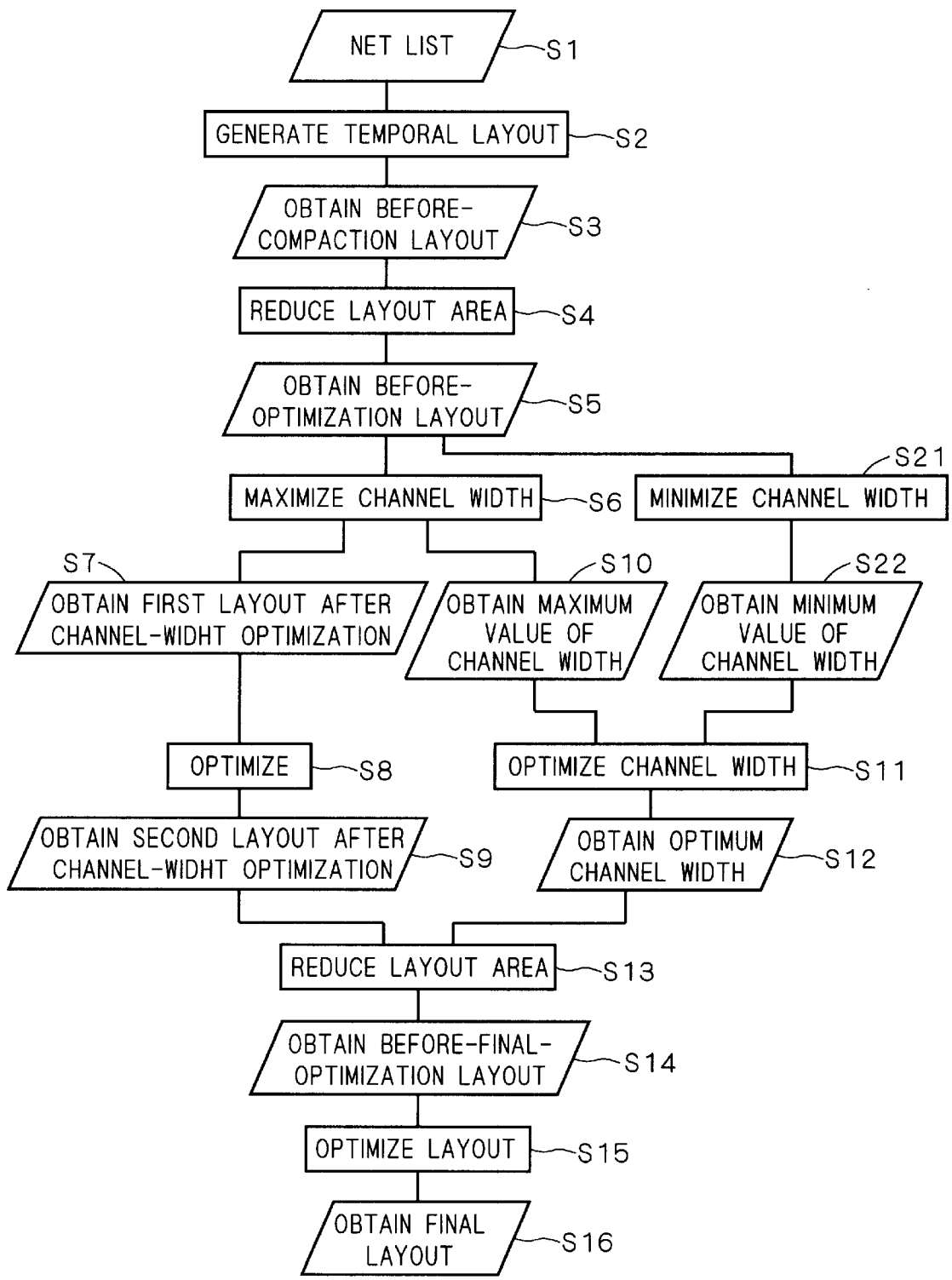
FIG. 10 is a flowchart illustrating the operation of the layout generating apparatus of the second preferred embodiment.

The procedure of layout generation is described with respect to FIG. 10 that is a flowchart of the operation of the layout generating apparatus 200, and the function and operation of the channel-width minimization processing part 11 are also described.

In FIG. 10, the same references have been used as in FIG. 5 for similar operations. The description of the same operations is omitted herein.

Referring to FIG. 10, the operations of steps S1 to S5 are performed to obtain a before-optimization layout.

In step S6, the before-optimization layout data is inputted to the second compaction processing part 4 in FIG. 9, to perform a maximization processing of a channel width. In step S21, the before-optimization layout data is inputted to the channel-width minimization processing part 11 in FIG. 9, to perform a channel-width minimization processing.

This processing corresponds to the minimization processing that is the second stage of the compaction processing described with respect to FIG. 3. At this stage, there is performed such an optimization processing of minimizing the channel width of each transistor without changing the layout area. Since the outline of this processing is already described with respect to FIG. 3, its detailed description is omitted herein. An exemplary layout to be obtained this processing is illustrated in FIG. 11.

Figure 11:
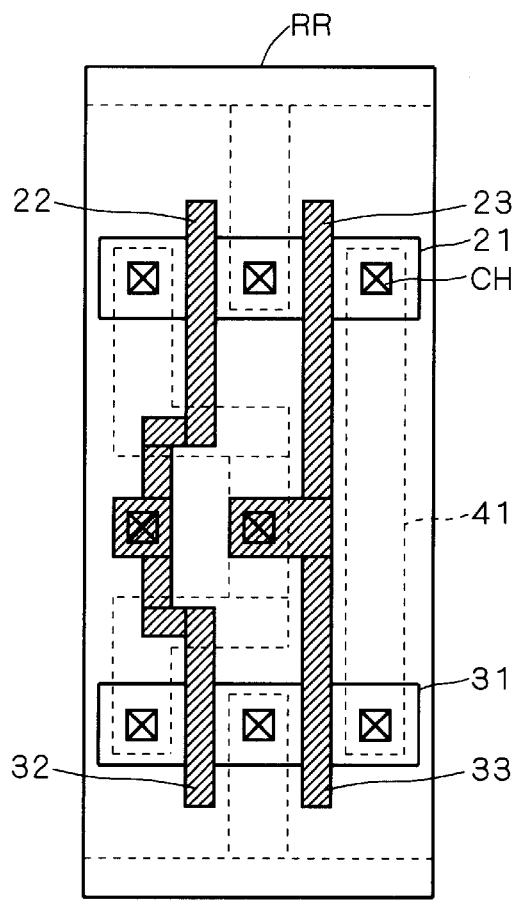
FIG. 11 is a layout diagram illustrating the layout generation steps in the layout generating apparatus of the second preferred embodiment.

FIG. 11 illustrates one exemplary layout to be obtained based on the before-optimization layout shown in FIG. 6. In FIG. 11, the same references have been used as in FIG. 6 for similar components. The description of the same components is omitted herein.

Referring to FIG. 11, the lengths of gate electrodes 22, 23 and gate electrodes 32, 33, are the same as in FIG. 6. Active areas 21 and 31 are more reduced than that in FIG. 6, such that the channel width of each transistor is minimized, resulting in the minimized transistor size.

Then, a channel-width minimization processing is performed to obtain a layout having the minimized channel width. From this layout data, only data of the channel width of each transistor is separated and it is obtained as data of the minimum value of channel width (step S22). This data may be stored in the mid-course-processing data storage part 6, and it may be read out on demand in the processing of step S11. The layout having the minimized channel width is then cancelled.

In step S11, the data of the channel-width maximum value obtained in step S10 and the data of the channel-width minimum value obtained in step S22 are both inputted to the channel-width optimization processing part 7 in FIG. 10, to perform a channel-width optimization processing.

The optimization processing in step S11 is to determine the channel width by using the maximized channel width as an upper limit value and the minimized channel width as a lower limit value.

In the layout generating apparatus 100 of the first preferred embodiment, only the maximized channel width is used as an upper limit value in the processing of step S11. In this case, however, depending on the channel width optimization, the channel width becomes too small, resulting in a large layout area or failing to generate a layout.

When the lower limit value of a channel width is set without taking the layout shape into consideration, the layout area might increase. This will next be described taking layouts shown in FIGS. 12 and 13 as example.

Figure 12:
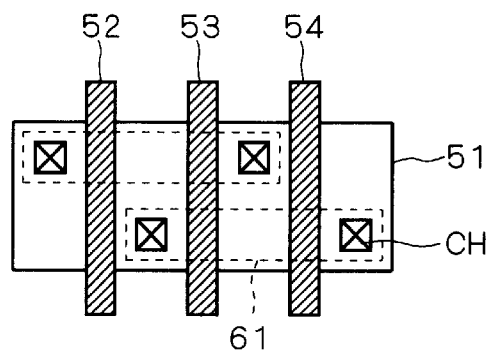

Referring to FIG. 12, gate electrodes 52, 53 and 54 are placed in parallel on an active area 51. The portions of the active area 51, which locate at the side exterior in the longitudinal direction of the gate electrodes 52 to 54, become source/drain regions. Each of the source/drain regions is connected via a plurality of contact portions CH to an overlying first layer metal wiring 61. The portions of the active area 51, which underlie the gate electrodes 52 to 54, become channel regions.

In FIG. 12, although the active area 51 is relatively large, the first layer metal wiring 61 is disposed in a region above the active area 51.

FIG. 13 illustrates the result obtained by performing a channel-width optimization processing with respect to the layout of FIG. 12. In FIG. 13, an active area 51 is minimized and gate electrodes 52 to 54 are made shorter, so that the transistor size is smaller than that of FIG. 12, whereas the layout area for a first layer metal wiring 61 is increased.

The case of failing to generate a layout is described by referring to FIG. 14. In FIG. 14, a gate electrode 72 divides an active area 71 into two parts that become source/drain regions. Contact portions CH are respectively disposed at the locations of the source/drain regions, which correspond to the diagonal portions of the active area 71. The source/drain regions are connected via contact portions CH to an overlying first layer metal wiring 73. Above the gate electrode 72, a first layer metal wiring 74 is disposed orthogonal to the direction that the gate electrode 72 extends.

In this layout, the first layer metal wiring 74 is an obstacle to the layout reduction, failing to execute no further reduction. Therefore, even when the layout generating apparatus 200 is directed to reduce this transistor size, the layout generation is not executable and the processing cannot be continued.

Thus, when the lower limit value of the channel width is set without taking the layout shape into consideration, there is the possibility of increasing the layout area or failing to perform the layout generation. However, according to the second preferred embodiment, in step S21 the channel width of each transistor is minimized without changing the layout area. Therefore, an appropriate lower limit value for channel-width optimization processing can be obtained to avoid that an excessive small channel width causes an increase of layout area or failure of layout generation.

Returning to the flowchart of FIG. 10, in step S11, after setting the upper and lower limit values of the channel width, its optimization processing is performed to obtain data of the optimized channel width (step S12).

The operations of steps S7 to S9 are the same as in the layout generating apparatus 100. The data of the channel width optimized in consideration of the upper and lower limit values of the channel width, and the second layout after channel-width maximization obtained in step S9, are both inputted to the first compaction processing part 3 in FIG. 9, to perform a layout-area reduction (step S13).

The following operations are the same as in the layout generating apparatus 100. However, it should be noted that the final layout having the optimized channel width obtained in step S16 is one which is obtained by taking the lower limit value of the channel width into consideration.

B-3. Resulting Effects

As set forth, the layout generating apparatus 200 of the second preferred embodiment can provide the layout in which the channel width is optimized more accurately based on the layout constraint.

As a result, there is no possibility that an excessive reduction of the channel width causes an increase in layout area, thus failing to achieve the target layout area or generate a layout. This avoids elongating of the design period necessary for correction.

C. THIRD PREFERRED EMBODIMENT

C-1. Configuration of Apparatus

Figure 15:
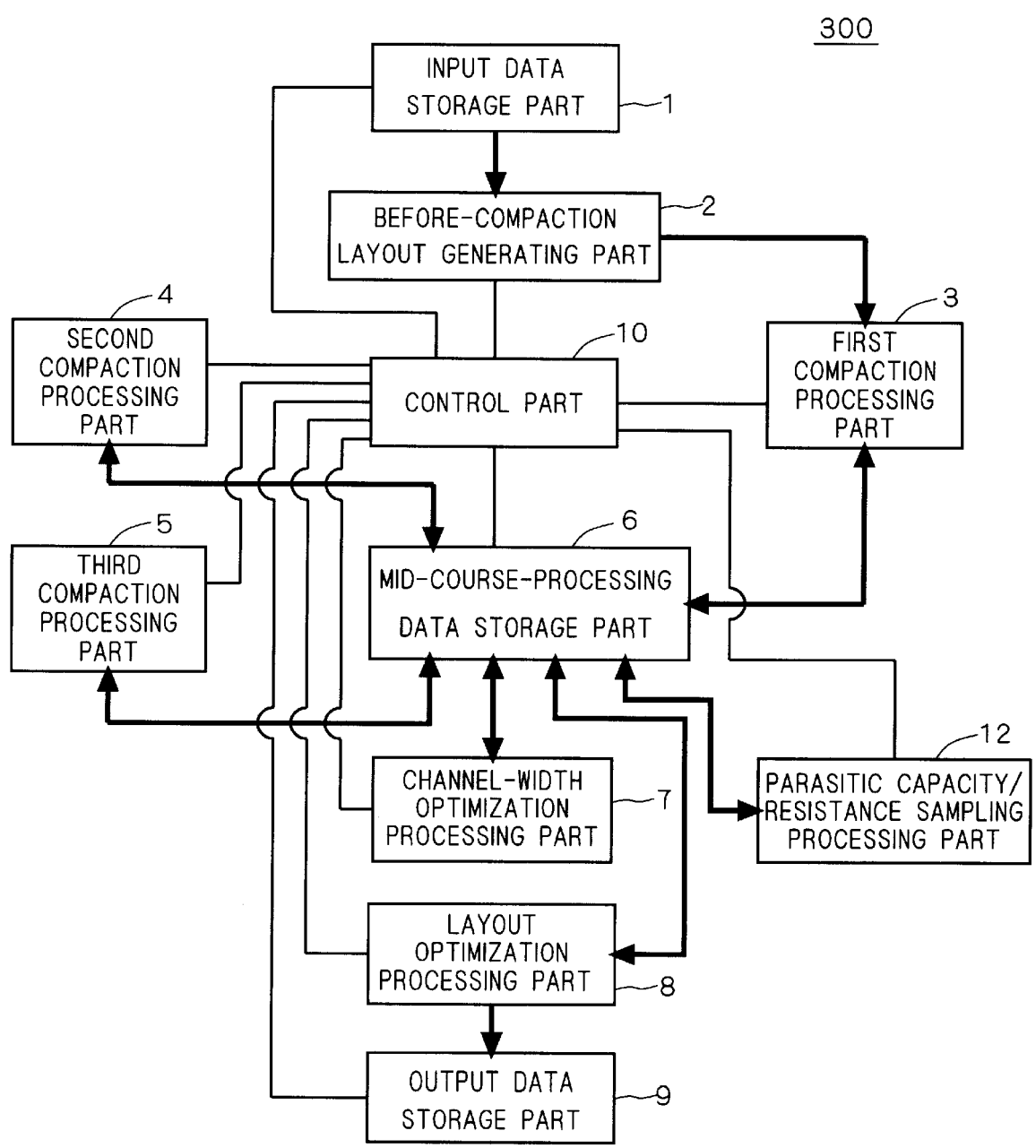
FIG. 15 is a block diagram illustrating the configuration of a layout generating apparatus according to a third preferred embodiment of the invention.

As a third preferred embodiment, the configuration of a layout generating apparatus 300 is illustrated in FIG. 15.

The layout generating apparatus 300 of FIG. 15 further comprises a parasitic capacity/resistance sampling processing part 12 to sample and process the parasitic capacities and resistance values of elements on a layout, in addition to the components of the layout generating apparatus 100 described with respect to FIG. 4. The operation of the parasitic capacity/resistance sampling processing part 12 is also controlled by the control part 10.

C-2. Operation of Apparatus

Figure 16:
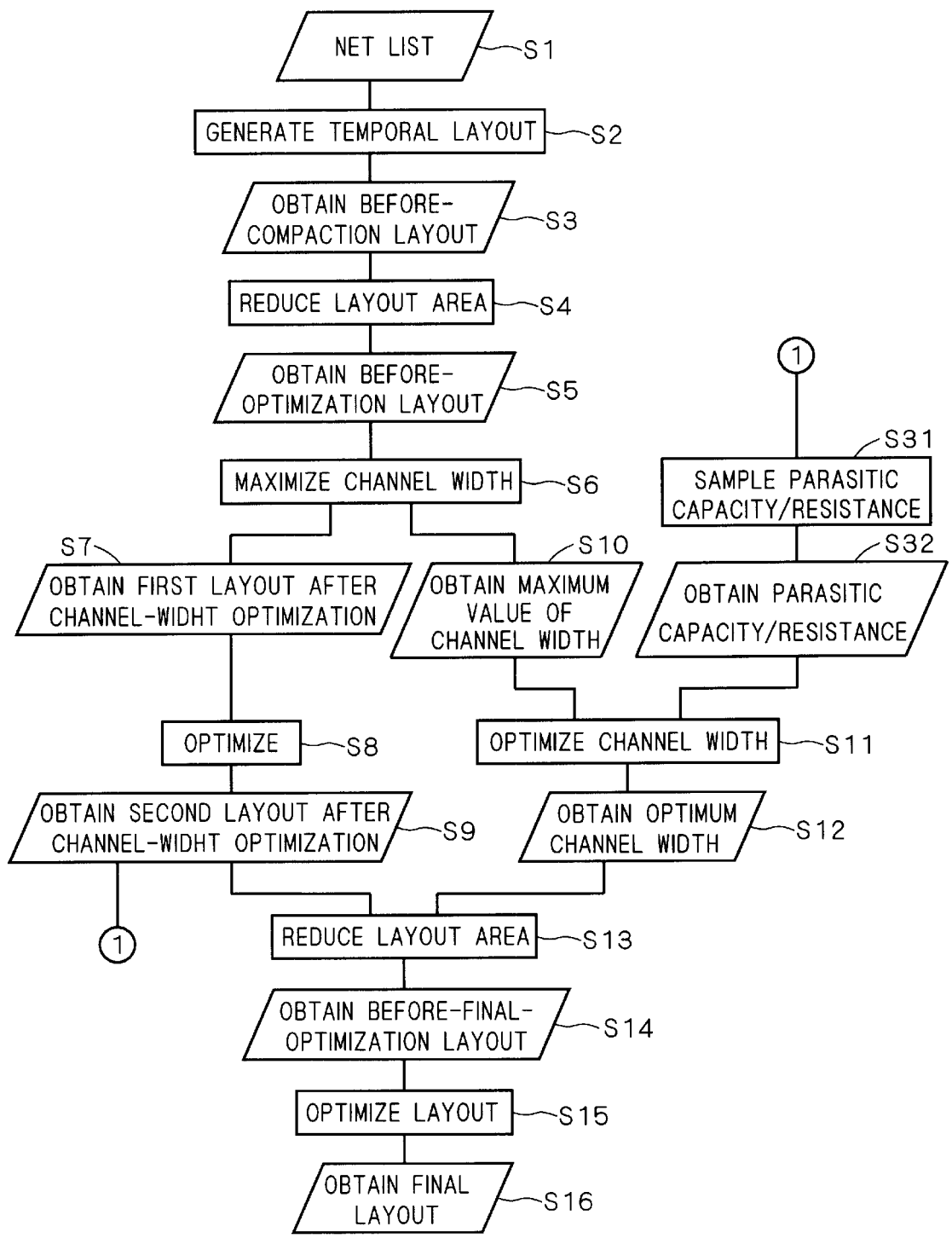
FIG. 16 is a flowchart illustrating the operation of the layout generating apparatus of the third preferred embodiment.

The procedure of layout generation is described with respect to FIG. 16 that is a flowchart of the operation of the layout generating apparatus 300, and the function and operation of the parasitic capacity/resistance sampling processing part 12 are also described.

In FIG. 16, the same references have been used as the layout generating apparatus 100 in FIG. 5 for similar operations. The description of the same operations is omitted herein. Note that in FIG. 16, portions indicated by mark ① means that the portions are connected to one another.

Referring to FIG. 16, the operations of steps S1 to S9 are performed to obtain a second layout after channel-width maximization in step S9.

The second layout after channel-width maximization is used in a layout-area reduction processing in step S13. This layout data is also inputted, in step S31, to the parasitic capacity/resistance sampling processing part 12 in FIG. 15.

In the parasitic capacity/resistance sampling processing part 12, the resistance values of various wirings, in particular, gate wirings including gate electrodes, and the parasitic capacities are calculated based on the received second layout after channel-width maximization.

The calculated resistance values and parasitic capacities are obtained as data (step S32), and then stored in the mid-course-processing data storage part 6. This data is read out on demand in the processing of step S11.

In step S11, the data of the channel-width maximum value obtained in step S10, and the data of the resistance values and parasitic capacities of the gate wiring obtained in step S32, are inputted to the channel-width optimization processing part 7 in FIG. 16, to perform a channel-width optimization processing.

Since this channel-width optimization is performed in consideration of not only the upper limit value of the channel width but also the constraint on the resistance values and parasitic capacities of the gate wiring, the reliability of the channel-width optimization result can be improved.

Returning to the flowchart of FIG. 16, in step S11, setting the upper limit value of channel widths and the resistance values and parasitic capacities of the gate wiring, a channel-width optimization processing is executed to obtain data of the optimized channel width (step S12).

Subsequently, the data of the channel width optimized in consideration of the upper limit value of the channel width, as well as the resistance values and parasitic capacities of the gate wiring, and the second layout after channel-width maximization obtained in step S9, are inputted to the first compaction processing part 3 in FIG. 15, to perform a layout-area reduction (step S13).

The following operations are the same as in the layout generating apparatus 100. However, it should be noted that the final layout having the optimized channel width obtained in step S16 is one which is obtained by taking the resistance values and parasitic capacities of the gate wirings into consideration.

C-3. Resulting Effects

As set forth, in accordance with the layout generating apparatus 300 of the third preferred embodiment, the channel width optimization is performed in consideration of not only the layout constraint but also the resistance values and parasitic capacities of the gate wiring, thereby obtaining the channel-width optimization result of high accuracy.

As a result, there is no possibility of failing to obtain a desired characteristic due to a channel-width optimization processing of low accuracy, thereby avoiding elongating of the design period necessary for correction.

The parasitic capacity/resistance sampling processing part 12 may be added to the layout generating apparatus 200 of the second preferred embodiment.

D. Modifications

In the foregoing layout generating apparatuses 100, 200 and 300 of the first to third preferred embodiments, the operation of the before-compaction layout generating part 2 is described on the assumption of the layout synthesis processing that generates a temporal layout based on a net list. The before-compaction layout generating part 2 may perform a technology migration processing in which an existing layout drawn by a certain design rule is changed and its compaction processing is performed to generate a layout under a desired design rule.

Figure 17:
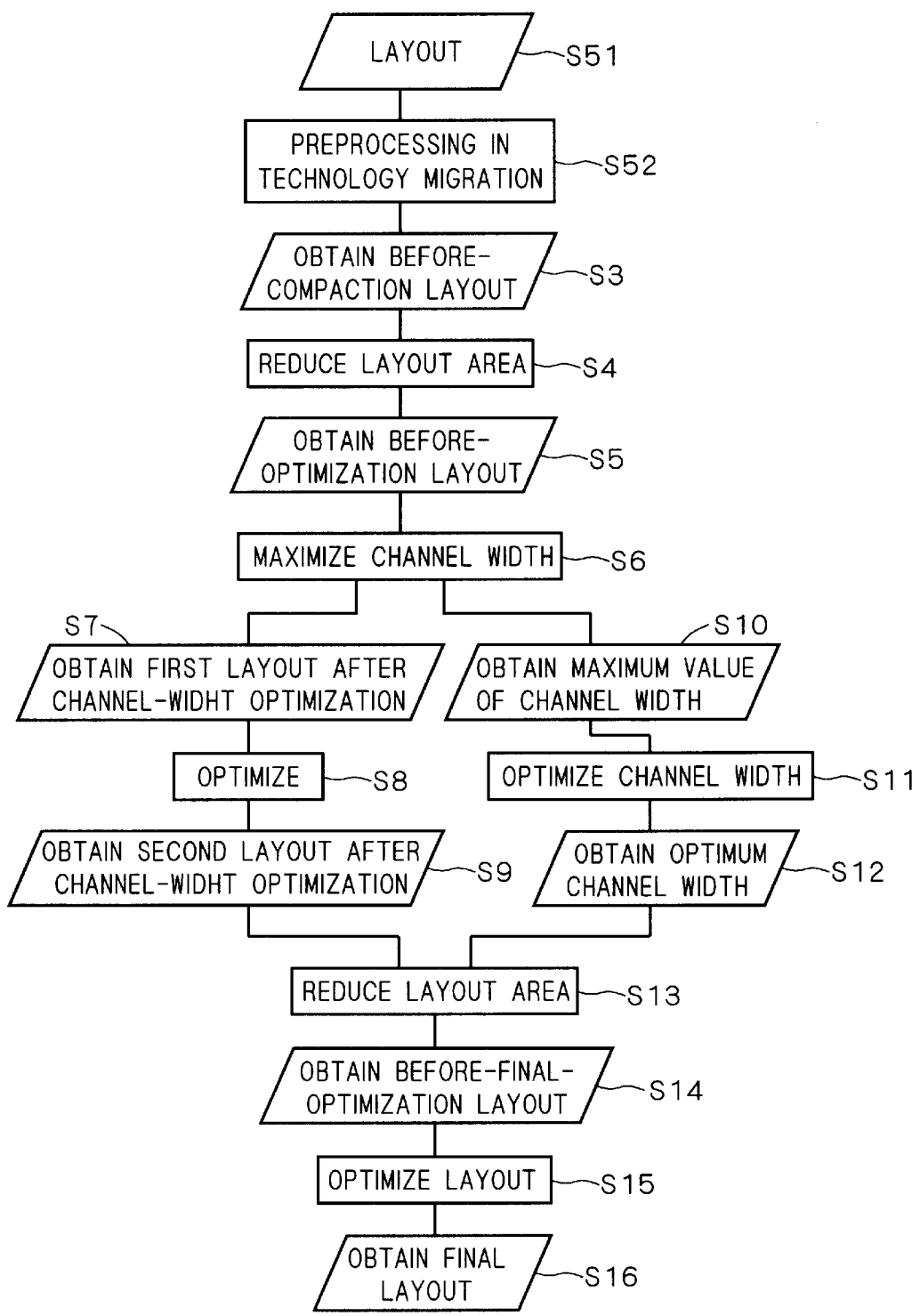
FIG. 17 is a flowchart illustrating the operation of a modification of the layout generating apparatus in the first preferred embodiment.

For instance, the flowchart of FIG. 17 corresponds to the flowchart of FIG. 5, but there are the following differences. Referring to FIG. 5, the temporal layout is generated based on the data of a net list in the before-compaction layout generating part 2 (FIG. 4). Referring to FIG. 17, in step S51, existing layout data is inputted to the before-compaction layout generating part 2 (FIG. 4). In order to obtain a better result in the following compaction processing, the before-compaction processing part 2 performs a preprocessing in the technology migration processing (step 52), such as connection of contacts having the same potential, insertion of jogs (the folding portions for conducting compaction processing while avoiding adjacent patterns), and correction of transistor sizes.

Through the preprocessing of this technology migration processing, a before-compaction layout is obtained (step S3). The following processing is the same as in the flowchart of FIG. 5. As used herein, the technology migration processing is made up of the preprocessing in step S52 and the compaction processing in step S4.

Thus, the use of the technology migration processing for obtaining a before-compaction layout permits the use of the existing layout as an input data of the layout generating apparatus 100. Although it is a temporary layout, design period can be shorter than the layout synthesis processing that generates a layout from a net list.

There is also the advantage that a temporary layout relatively close to a desired layout can be obtained by employing the technology migration processing.

Specifically, as existing layout, a high quality one is generally used in the technology migration processing, therefore, the mentioned temporary layout can be obtained by making slight change in design rule. Thereby, the design period can be shorter than the case that a new layout is made from a net list data based on a new design rule.

On the other hand, the layout synthesis processing of generating a layout from a net list can be employed in generating various circuit layouts made under various design rules, and also permit such flexible operation that a layout shape to be outputted can be controlled to a certain degree.

Figure 18:
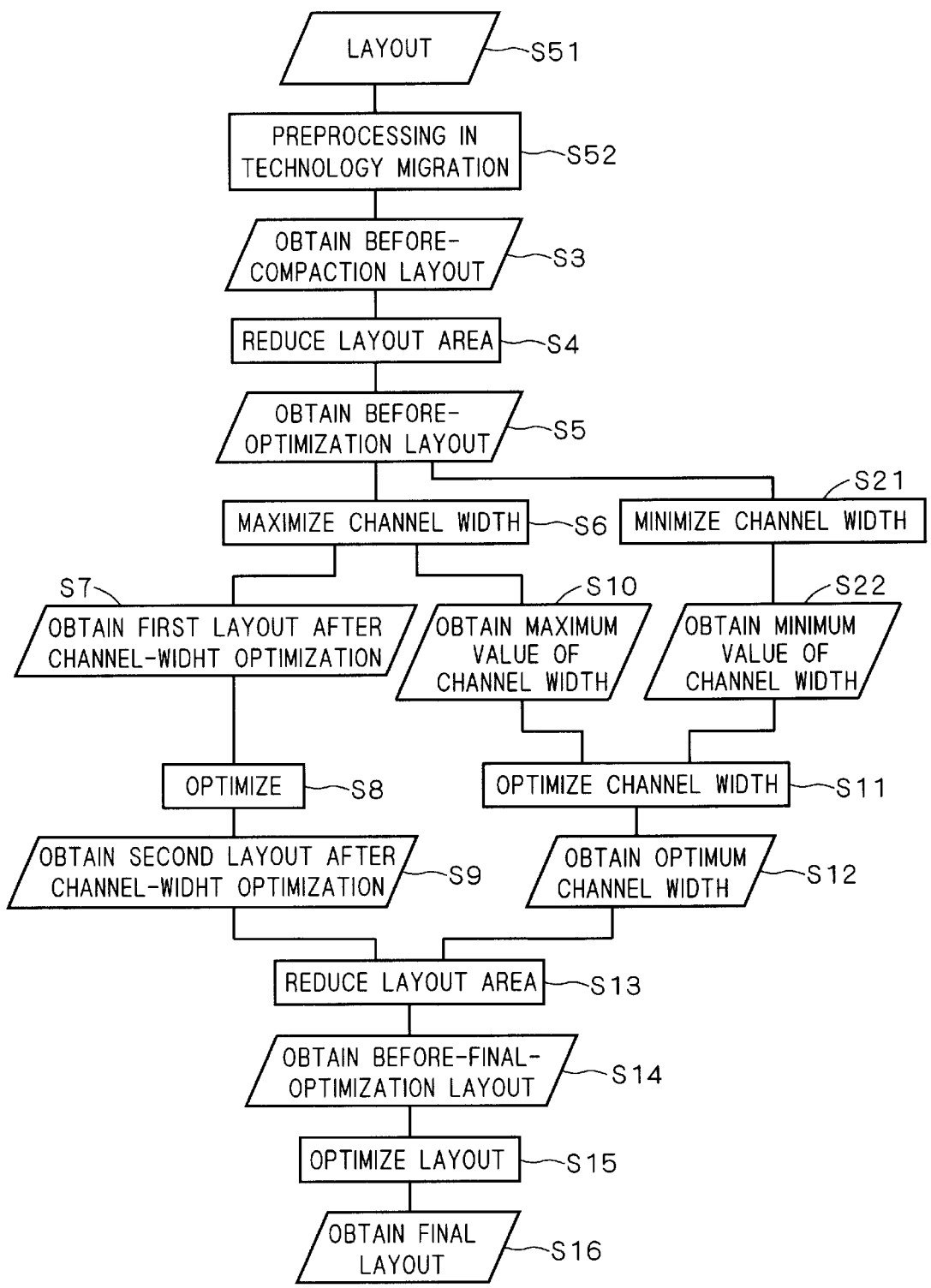
FIG. 18 is a flowchart illustrating the operation of a modification of the layout generating apparatus in the second preferred embodiment.
Figure 19:
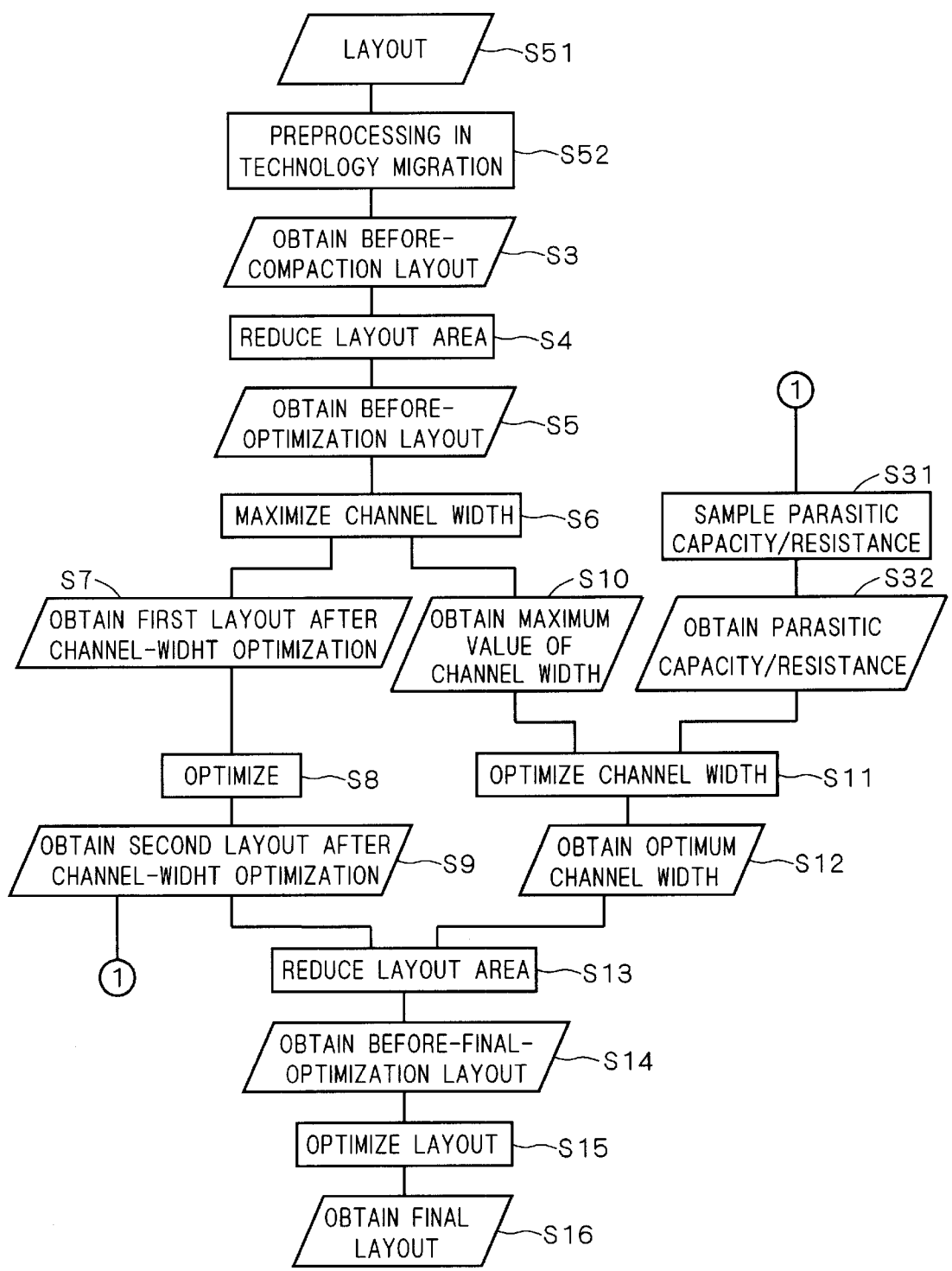
FIG. 19 is a flowchart illustrating the operation of a modification of the layout generating apparatus in the third preferred embodiment.

The flowchart of FIG. 18 corresponds to the flowchart of FIG. 10, and the flowchart of FIG. 19 corresponds to the flowchart of FIG. 16. In any case, the before-compaction layout generating part 2 executes the preprocessing in the technology migration processing (steps S51 and S52).

In any case, the processing to be performed after step S52 are the same as in the flowchart shown in FIGS. 10 and 18. That is, the effect of reducing design period is obtainable in addition to the effects described in the second and third preferred embodiments.

E. Examples of Layout Generating Apparatus

Figure 20:
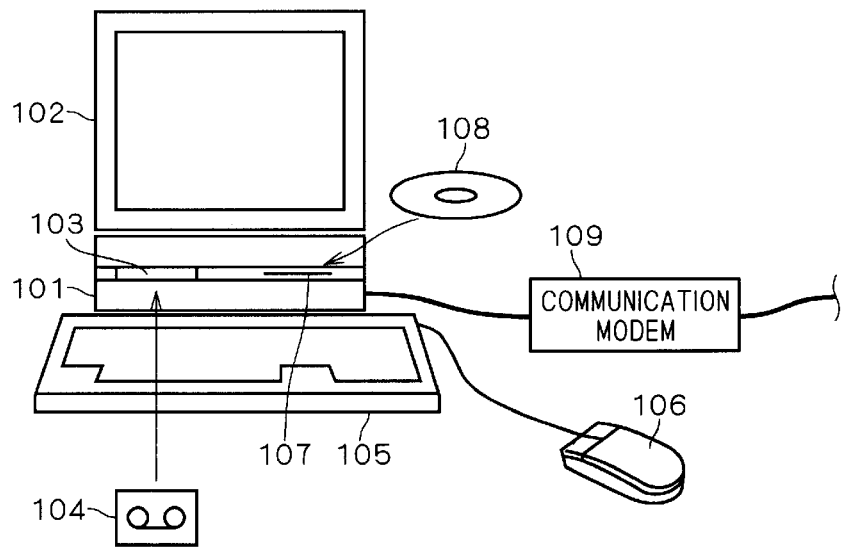
FIG. 20 is an external view of a computer system that realizes the layout generating apparatuses of the invention.

For the practice of the layout generating apparatuses 100, 200 and 300 of the foregoing first, second and third preferred embodiments, for example, such a computer system as shown in FIG. 20 may be utilized.

Referring to FIG. 20, the layout generating apparatuses 100, 200 and 300 comprise: a computer body 101; display device 102, magnetic tape device 103 into which a magnetic tape 104 is fitted; keyboard 105; mouse 106; CD-ROM device 107 into which a CD-ROM (compact disk-read only memory) 108 is fitted; and communication modem 109.

The functions of the before-compaction layout generating part 2, the first, second and third compaction processing parts 3, 4, 5, the channel-width optimization processing part 7, the layout optimization processing part 8 and the control part 10, all of which are common to the layout generating apparatuses 100, 200 and 300; the function of the channel-width minimization processing part 11 of the layout generating apparatus 200; and the function of the parasitic capacity/resistance sampling processing part 12 of the layout generating apparatus 300, can be realized by executing a computer program (layout generation program) on computer. In this case, the program is fed by a storage medium, such as the magnetic tape 104 or CD-ROM 108. The program can be propagated on a communication path in the form of signals, and also be downloaded on a storage medium.

The layout generation program is executed by the computer body 101. A layout is automatically generated in the following manner that the operator operates the keyboard 105 or mouse 106 while watching the display device 102. The layout generation program may be fed from another computer to the computer body 101 through communication lines and then the communication modem 109.

Figure 21:
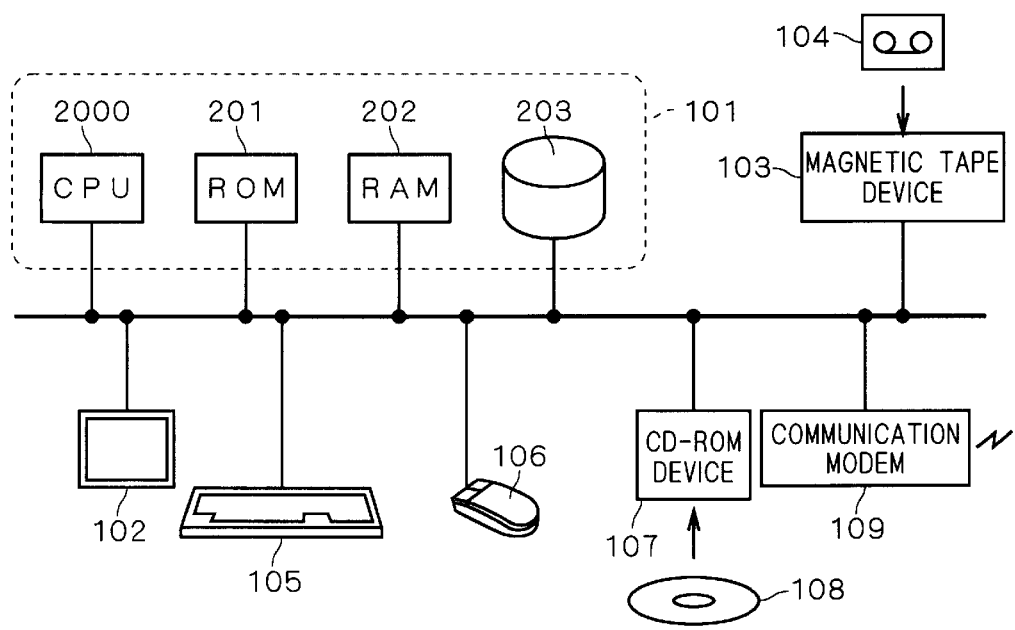
FIG. 21 is a diagram illustrating the configuration of the computer system.
Figure 22:
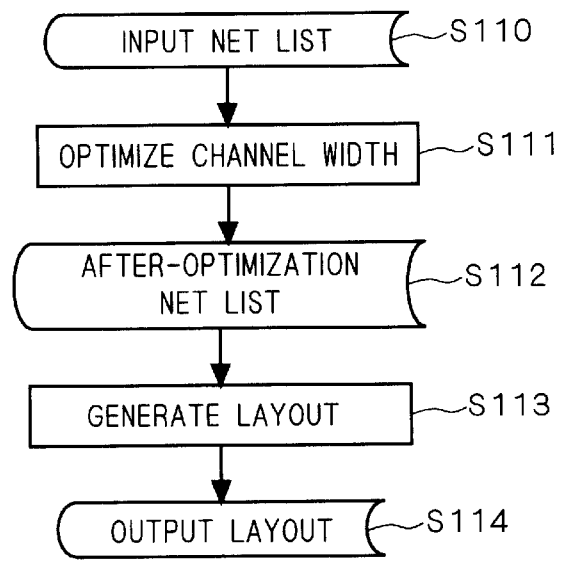
FIG. 22 is a flowchart illustrating a conventional layout generating method.
Figure 23:
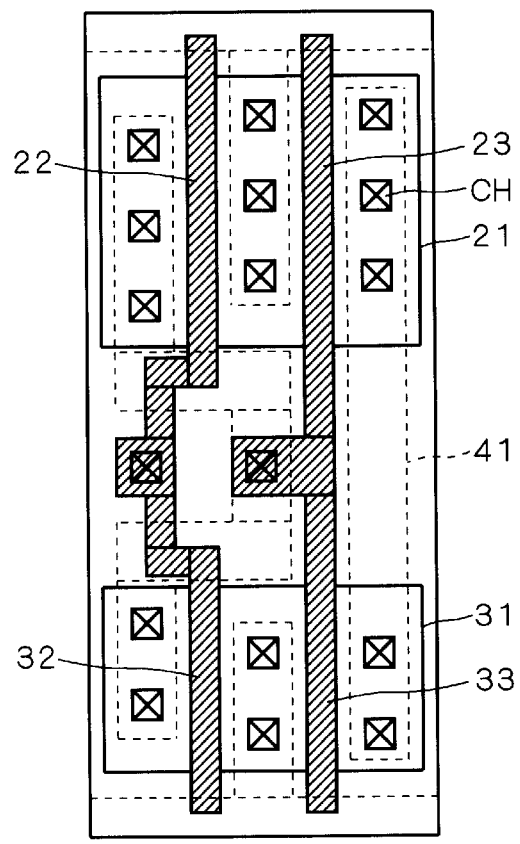
FIG. 23 is a layout diagram illustrating the problem of the conventional layout generating method.

FIG. 21 is a block diagram of the computer system configuration shown in FIG. 20. The computer body 101 in FIG. 20 has CPU (central processing unit) 2000, ROM (read only memory) 201, RAM (random access memory) 202, and hard disk 203.

The CPU 2000 executes processing while inputting/outputting data among the display device 102, magnetic tape device 103, keyboard 105, mouse 106, CD-ROM device 107, communication modem 109, ROM 201, RAM 202, and hard disk 203.

The layout generation program stored in the magnetic tape 104 or CD-ROM 108 is temporarily stored in the hard disk 203 by the CPU 2000. The CPU 2000 loads the layout generation program from the hard disk 203 to the RAM 202, and executes the program to perform a layout generation.

The input data storage part 1, mid-course-processing data storage part 6, output data storage part 9, all of which are common to the layout generating apparatuses 100, 200 and 300, may be disposed in portions other than the program storage region of the RAM 202. Alternatively, the hard disk 203 may store the data to be stored in these parts 1, 6, 9.

The foregoing computer system is given only as example and without limitation. Any computer system, which can execute the layout generation program, can be used. Any storage medium other than the magnetic tape 104 and CD-ROM 108 can be used.

While the invention has been shown and described in detail, the foregoing description is in all aspects illustrative and not restrictive. It is therefore understood that numerous modifications and variations can be devised without departing from the scope of the invention.

What is claimed is:

1. A layout generating apparatus to generate a layout of a semiconductor integrated circuit, comprising:

a compaction processing part to perform a compaction processing for converting an inputted input layout into a layout satisfying a predetermined design rule; and a channel-width optimization processing part to optimize a channel width of a transistor forming said semiconductor integrated circuit, said compaction processing part having a channel-width maximization processing part that maximizes the channel width of said transistor without changing a layout area to generate a layout after channel-width maximization and obtain a maximum channel-width value, said channel-width optimization processing part optimizing the channel width of said transistor by using said maximum channel-width value as an upper limit value.

2. The layout generating apparatus according to claim 1 wherein said compaction processing part further has a channel-width minimization processing part that minimizes the channel width of said transistor without changing a layout area to generate a layout after channel-width minimization and obtain a minimum channel-width value; and said channel-width optimization processing part optimizes the channel width of said transistor by using said maximum channel-width value as an upper limit value and said minimum channel-width value as a lower limit value.

3. The layout generating apparatus according to claim 1 further comprising:

a parasitic capacity/resistance sampling processing part to obtain a parasitic capacity and a resistance value of wiring of said transistor based on said layout after channel-width maximization, wherein said channel-width optimization processing part optimizes the channel width of said transistor on receipt of data of said parasitic capacity and said resistance value.

4. The layout generating apparatus according to claim 1 wherein said input layout is a temporal layout generated based on a net list data.

5. The layout generating apparatus according to claim 1 wherein said input layout is obtained by subjecting a layout generated under a design rule different from said predetermined design rule, to a preprocessing in a technology migration processing.

6. A layout generating method of generating a layout of a semiconductor integrated circuit comprising the steps of:

(a) performing a compaction processing for converting an inputted input layout into a layout satisfying a predetermined design rule; and (b) optimizing the channel width of a transistor forming said semiconductor integrated circuit, said step (a) including:

(a-1) maximizing the channel width of said transistor without changing a layout area to obtain a layout after channel-width maximization; and (a-2) obtaining a maximum channel-width value from said layout after channel-width maximization, said step (b) including the step of:

optimizing the channel width of said transistor by using said maximum channel-width value as an upper limit value.

7. The layout generating method according to claim 6 wherein said step (a) further including:

(a-3) minimizing the channel width of said transistor without changing a layout area to obtain a layout after channel-width minimization; and (a-4) obtaining a minimum channel-width value from said layout after channel-width minimization, said step (b) including the step of:

optimizing the channel width of said transistor by using said maximum channel-width value as an upper limit value and said minimum channel-width value as a lower limit value.

8. The layout generating method according to claim 6 further comprising:

the step (c), prior to said step (b), of obtaining a parasitic capacity and a resistance value of wiring of said transistor based on said layout after channel-width maximization, said step (b) including the step of:

optimizing the channel width of said transistor on receipt of data of said parasitic capacity and said resistance value.

9. The layout generating method according to claim 6 wherein said input layout is generated as a temporal layout, prior to said step (a) and based on a net list data.

10. The layout generating method according to claim 6 wherein said input layout is obtained, prior to said step (a), by subjecting a layout generated under a design rule different from said predetermined design rule to a preprocessing in a technology migration processing.

11. A program for directing a computer to execute the layout generating method according to claim 6.

* * * * *